(12) United States Patent
Maeda

(10) Patent No.: US 7,035,395 B2
(45) Date of Patent: Apr. 25, 2006

(54) DIGITAL COMMUNICATION SYSTEM

(75) Inventor: Kazuaki Maeda, Hyogo (JP)

(73) Assignee: Toa Corporation, Hyogo (JP)

( * ) Notice: Subject to any disclaimer, the term of this patent is extended or adjusted under 35 U.S.C. 154(b) by 393 days.

(21) Appl. No.: 10/182,523

(22) PCT Filed: Jan. 30, 2001

(86) PCT No.: PCT/JP01/00604

§ 371 (c)(1),
(2), (4) Date: Nov. 14, 2002

(87) PCT Pub. No.: WO01/58021

PCT Pub. Date: Aug. 9, 2001

(65) Prior Publication Data

US 2003/0123480 A1 Jul. 3, 2003

(30) Foreign Application Priority Data

Jan. 31, 2000 (JP) .............................. 2000-021986

(51) Int. Cl.
*H04M 1/00* (2006.01)
(52) U.S. Cl. ........................ 379/387.01; 379/388.06; 379/387.02
(58) Field of Classification Search .......... 379/387.01, 379/387.02, 388.06
See application file for complete search history.

(56) References Cited

FOREIGN PATENT DOCUMENTS

| JP | 56-79509 A | 6/1981 |
|---|---|---|
| JP | 2-171051 A | 7/1990 |
| JP | 3-72721 A | 3/1991 |
| JP | 4-111536 A | 4/1992 |
| JP | 4-144314 A | 5/1992 |
| JP | 5-14198 A | 1/1993 |
| JP | 7-95086 A | 4/1995 |
| JP | 10-336037 A | 12/1998 |
| JP | 11-340831 A | 10/1999 |

*Primary Examiner*—Jefferey F. Harold
(74) *Attorney, Agent, or Firm*—Townsend and Townsend and Crew LLP

(57) ABSTRACT

The present invention provides a digital communication system which is free from noise generated in a receiver. A transmitter converts an analog input signal to a digital signal, and then a power level detector 5 compares the digital signal with a predetermined level. In accordance with the result, the transmitter transmits a transmission signal which includes the digital signal or a digital signal amplified from that digital signal, and a control bit indicative of the result of comparison. The receiver, in accordance with the control bit included in the received digital signal, outputs an analog signal converted from the received digital signal or an analog signal converted from the received digital signal after it is digitally amplified.

5 Claims, 3 Drawing Sheets (a)

(b)

DIGITAL COMMUNICATION SYSTEM

FIELD OF THE INVENTION

The present invention relates to a digital communication system for converting an analog signal such as an audio signal input from a microphone into a digital format for transmission, and more particularly, to a digital communication system which can remove noise by performing switching and signal amplification in a digital signal domain in a transmitter, and reduces a bit rate to reduce a used frequency bandwidth.

DESCRIPTION OF THE PRIOR ART

FIGS. 1 and 2 generally illustrate the configuration of a transmitter and a receiver, respectively, according to an invention filed under the title of "Digital Communication System" on Jan. 31, 1999. First, FIG. 1 generally illustrates the configuration of a transmitter which may be used in the digital communication system. An output of a microphone 21 applied with an analog input signal is amplified by an analog amplifier 22, and divided into two, one of which is applied to a first A/D converter 23, and the other of which is applied to a second A/D converter 25 through an analog amplifier 24. The analog amplifier 24 has an amplification ratio of i decibel (for example, 24 dB), while the first A/D converter 23 and second A/D converter 25 have a resolution of j bits (for example, 16 bits).

Outputs of the first A/D converter 23 and second A/D converter 25 are respectively applied to a power level detector 26, and the output of the first A/D converter 23 is connected to a first fixed contact 271 of a switch 27, while the output of the second A/D converter 25 is connected to a second fixed contact 272 of the switch 27. The switch 27 has a movable contact 273 connected to the transmission signal processing unit 28, the output of which is modulated by a digital modulator 29 and then transmitted from an antenna. The first A/D converter 23 and second A/D converter 25 respectively has a resolution of j bits (for example, 16 bits).

The power level detector 26 detects the output power level of the first A/D converter 23 to output control data for controlling the operation of the switch 27. Specifically, the power level detector 26 controls the operation of the switch 27 using the control data such that the first fixed contact 271 of the switch 27 is connected to the movable contact 273 when the output power of the first A/D converter 23 is higher than a predetermined power level, and the second fixed contact 272 of the switch 27 is connected to the movable contact 273 when the output power of the first A/D converter 23 is lower than the predetermined power level. In this way, the signal amplified by the analog amplifier 24 to have a higher level is A/D converted when the level of the analog input signal is lower than a predetermined level.

The power level detector 26 controls the switching operation of the switch 27 as described above, as well as sends to the transmission signal processing unit 28 a signal indicating whether or not an analog input signal applied to the microphone 21 is higher or lower than the predetermined level, in other words, a selection signal indicating which of the first A/D converter 23 and second A/D converter 25 is selected. In response to this selection signal, the transmission signal processing unit 28 operates to add control bits corresponding to the selection signal to a digital signal which is the output of the first A/D converter 23 or the output of the second A/D converter 25.

The control bits preferably have two bits in order to improve the reliability in consideration of bit errors actually produced on a communication path. Therefore, as an example, the control bits take logical "11" when the power level detector 26 operates the switch 27 to connect the movable contact 273 to the first fixed contact 271 in order to select the output of the first A/D converter 23, and takes logical "00" when the power level detector 26 conversely operates the switch 27 to contact the movable contact 273 to the second fixed contact 272 in order to select the output of the second A/D converter 25.

The transmission digital signal, to which the control bits are added in the transmission signal processing unit 28, is modulated in accordance with a predetermined digital modulation scheme by the digital modulator 29, and transmitted from a transmission antenna.

FIG. 2 illustrates an exemplary configuration of a receiver which may be used in the digital communication system. A signal transmitted from the transmitter of FIG. 1 is received by a reception antenna and input to a digital demodulator 31 which demodulates the signal to a received digital signal corresponding to the transmitted digital signal, which is then applied to a received signal processing unit 32. The received signal processing unit 32 extracts the control bits within the received digital signal for controlling the operation of a switch 33, and outputs a digital signal from which a frame signal and parity bits included in the received digital signal are removed.

The output of the received signal processing unit 32 is connected to a movable contact 331 of the switch 33. The switch 33 has a first fixed contact 332 connected to an input of a D/A converter 34, and a second fixed contact 333 connected to an input of a digital amplifier 35. The D/A converter 34 converts the digital signal applied thereto to an analog signal corresponding to an analog input signal applied to the microphone 21 of the transmitter, and applies an analog amplifier 36 with the analog signal. The analog signal amplified by the analog amplifier 36 is output from a speaker 37.

The digital amplifier 35 in the receiver of FIG. 2 has an amplification ratio of −i decibel, i.e., an attenuation ratio of i decibel, so that the analog amplifier 24 in the transmitter has the amplification ratio of the same value as the attenuation ratio of the digital amplifier 35 in the receiver. The D/A converter 34 has a resolution of k bits (for example, 20 bits) which is higher in accuracy than that of the A/D converters 23, 25 on the transmission side.

The received signal processing unit 32 sends control data to the switch 33 for controlling the switch 3 to connect the movable contact 331 to the first fixed contact 332 when the control bits in the received digital signal are detected to be logical "11" and to connect the movable contact 331 to the second fixed contact 333 when the control bits C in the received digital signal are detected to be logical "00".

In this way, the digital signal output from the received signal processing unit 32 is supplied to the D/A converter 34 directly or through the digital amplifier 35 in accordance with the control bits sent from the transmitter, and converted to an analog signal therein.

In the digital communication system described above with reference to FIGS. 1, 2, the power level detector 26 detects whether or not the level of an analog input signal applied to the microphone 21 is higher or lower than the predetermined level. When the level of the analog input signal is higher than the predetermined level, a digital signal including a digital signal output from the first A/D converter 23 and the control bits at logical "11" is transmitted to the reception side. On the reception side, the received signal processing unit 32 detects that the control bits C are logical "11" and forces the switch 33 to connect the movable contact 331 to the first fixed contact 332.

On the other hand, when the power level detector 26 on the transmission side detects that the level of the analog signal is lower than the predetermined level, the analog input signal is amplified by the analog amplifier 24 having the amplification ratio of i decibel to increase the level, before the analog signal is A/D converted by the second A/D converter 25 and transmitted. Simultaneously, the control bits C at logical "00" indicating that the analog signal having an increased level has been digitized and transmitted is transmitted to the reception side. On the reception side, the received signal processing unit 32 detects that the control bits C included in a received digital signal are logical "00" and forces the switch 33 to connect the movable contact 331 to the second fixed contact 333. In this way, the digital signal output from the received signal processing unit 32 is attenuated by the digital amplifier 35 having the attenuation ratio of i decibel, before it is converted to an original analog signal by the D/A converter 34.

In this digital communication system, the transmitter and receiver configured as described above are used to perform the switching in the receiver in the digital domain, so that the digital amplifier 35 in the receiver will not experience variations in the attenuation ratio. Moreover, since the A/D converters and D/A converter used in the transmitter, for example, are lower in accuracy than the D/A converter in the receiver, the cost is reduced as the overall system. In addition, since the transmission path only has to occupy a j-bit bandwidth plus a bandwidth for the control bits, communications can be made at a bit rate close to that when j-bit A/D converters and D/A converter are used, thereby making it possible to narrow down the occupied frequency bandwidth and hence ensure a larger number of channels.

However, as long as the analog amplifier 24 is used in the transmitter, it is difficult to employ an analog amplifier which has an amplification ratio as prescribed. Therefore, even assuming that a line loss can be ignored in FIG. 1, if the analog amplifier 24 is implemented, for example, by a 24-dB amplifier, the difference in signal level between the input of the A/D converter 23 and the input of the A/D converter 25 is not exactly 24 dB, causing unbalanced outputs between these A/D converters.

Therefore, with simple attenuation of 24 dB on the receiver side, the unbalance produced on the transmitter side will be reflected as it is to the receiver side, causing large fluctuations in signal level during the operation of the switch 33. For example, when the analog amplifier in the transmitter has an amplification ratio larger than the prescribed 24 dB, a rise in signal level appears as shown in FIG. 3(a) at time t at which the movable contact 331 of the switch 33 in the receiver has been switched from the first fixed contact 332 to the second fixed contact 333. Conversely, when the analog amplifier in the transmitter has an amplification ratio smaller than the prescribed 24 dB, a fall in signal level appears as shown in FIG. 3(b) at time t at which the movable contact 331 of the switch 33 in the receiver has been switched from the first fixed contact 332 to the second fixed contact 333. In any case, such a sudden change in signal level causes noise in the receiver.

Further, since there is a phase difference between a path from the microphone 21 to the A/D converter 23 and a path from the microphone 21 to the A/D converter 25 in the transmitter, another problem arises in that noise is produced in the receiver due to this phase difference.

The present invention has been proposed to solve the foregoing problems inherent to the digital communication system, and it is an object of the invention to provide a digital communication system which is capable of preventing noise from occurring in a receiver.

SUMMARY OF THE INVENTION

The foregoing object is achieved by a digital communication system comprising at least one transmitter for digitizing an analog input signal for transmission, and at least one receiver for receiving a digital signal transmitted from the transmitter, wherein the digital communication system is characterized in that:

the transmitter converts the analog input signal to a digital signal, and transmits a transmission signal which includes either the digital signal or a digital signal produced by amplifying the digital signal, in accordance with the result of a comparison of a level of the analog input signal or a level of the digital signal with a predetermined level, and a control bit indicative of the result of comparison; and the receiver outputs, in accordance with the control bit included in a received digital signal, an analog signal converted from the received digital signal or an analog signal converted from the received digital signal after the received digital signal is digitally amplified.

According to one feature of the present invention, a digital communication system having at least one transmitter and at least one receiver for receiving a digital signal transmitted from the transmitter is provided, wherein the digital communication system is characterized in that:

the transmitter comprises:

input means for inputting an analog signal;

an A/D converter for digitizing the analog signal and outputting a digitized signal;

a selector for selecting the digital signal when a level of the analog signal or a level of the digital signal output from the A/D converter is higher than a predetermined level, and selecting an amplified digital signal produced by amplifying the digital signal when the level of the digital signal is lower than the predetermined level; and a transmission output unit for outputting a transmission signal which is a combination of the digital signal or the amplified digital signal selected by the selector and a control bit indicating which of the digital signal and the amplified digital signal is selected, and the receiver comprises:

a processing unit for selectively outputting, in accordance with the control bit included in a received digital signal, either the received digital signal or a digital signal produced by attenuating the received digital signal by a digital amplifier; and a reception output unit for outputting an analog signal analog converted from a digital signal output from the processing unit.

Preferably, the selector comprises:

a level detector for detecting whether the level of the analog signal or the level of the digital signal is higher or lower than the predetermined level; and a switch responsive to an output of the level detector for selecting either a path for sending the digital signal to the transmission output unit or a path for sending the digital signal to the transmission output unit after the digital signal is amplified.

The processing unit may comprise:

a received signal processing unit for extracting the control bit from the received digital signal;

a switch responsive to the control bit for selectively outputting either the received digital signal or a digital signal produced by amplifying the digital signal; and a D/A converter for converting an output from the switch to an analog signal.

The digital communication system according to the present invention may be implemented as a digital radio communication system such a wireless microphone.

The above and other objects and features of the present invention will become more apparent from the following detailed description when read with reference to the accompanying drawings.

DESCRIPTION OF THE PREFERRED EMBODIMENTS

Figure 1:
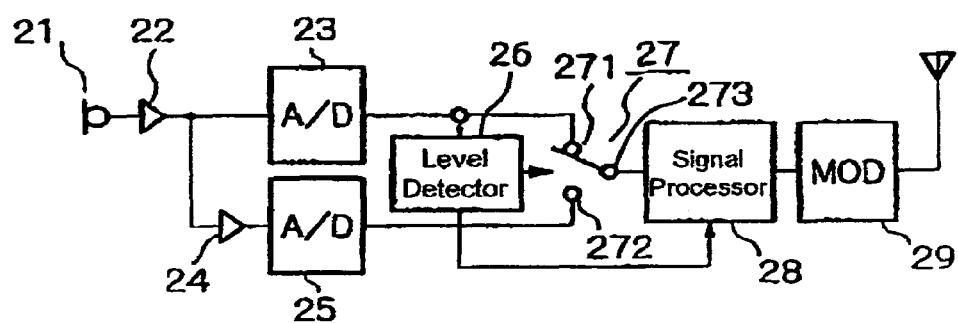
FIG. 1 is a diagram generally illustrating the configuration of a transmitter for use in a digital communication system according to an application commonly filed herewith.
Figure 2:
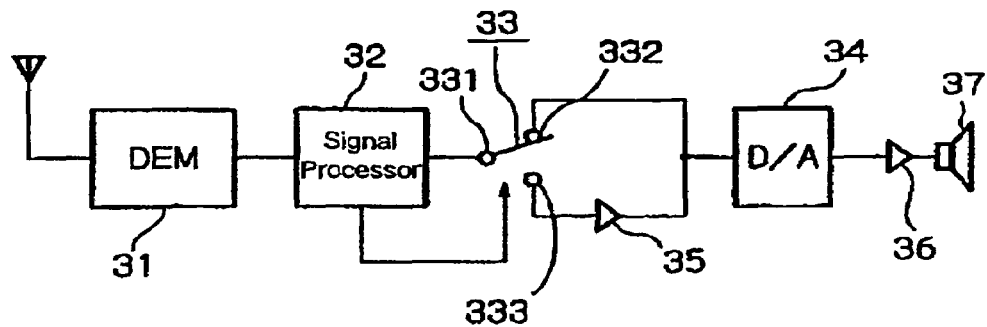
FIG. 2 is a diagram generally illustrating the configuration of a receiver which can be used in combination with the transmitter of FIG. 1.
Figure 3:
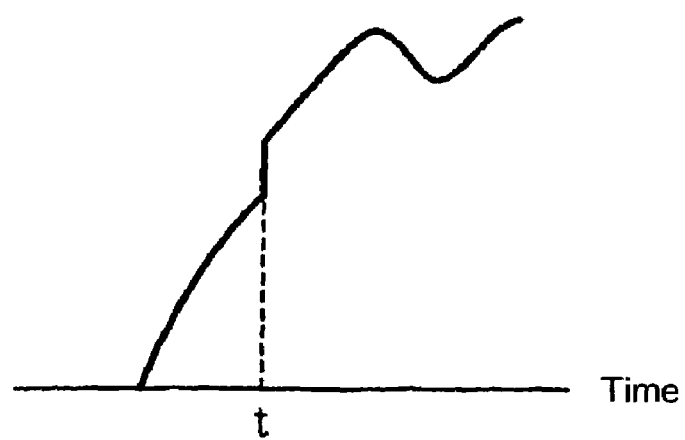
FIGS. 3(a) and 3(b) are diagrams for explaining the generation of switching noise in the receiver illustrated in FIG. 2.
Figure 3:
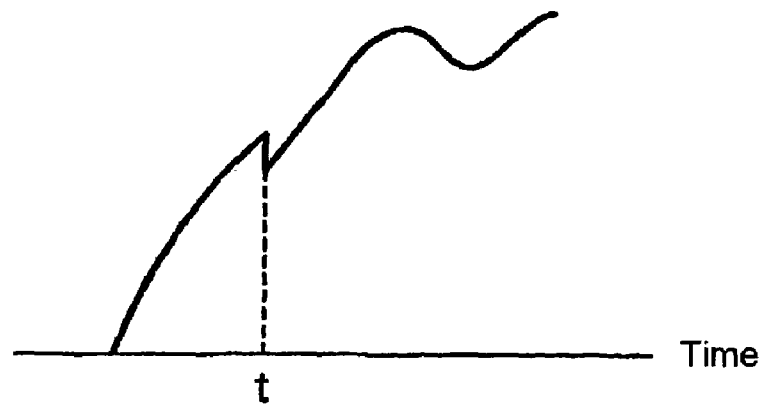
Figure 4:
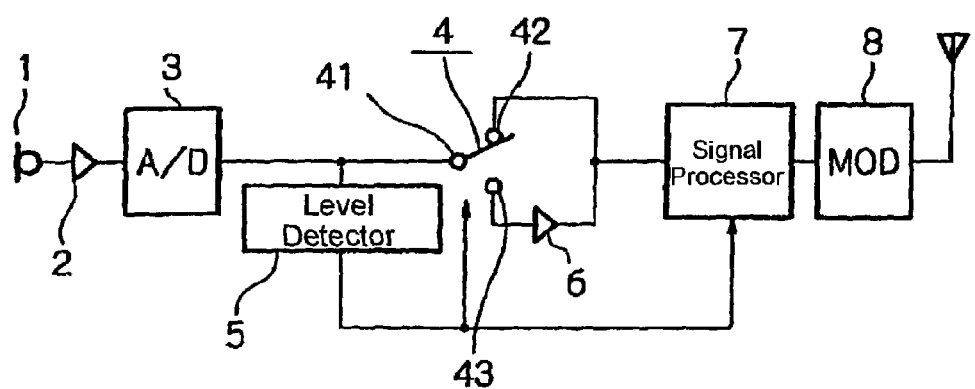
FIG. 4 is a diagram generally illustrating the configuration of an embodiment of a transmitter which can be used in a digital communication system according to the present invention.

A digital communication system according to the present invention is implemented by a transmitter, the configuration of which is illustrated in FIG. 4 as an example, and a receiver, the configuration of which is illustrated in FIG. 2 as an example. Since the receiver illustrated in FIG. 2 has been described in regard to the configuration and operation, repetitive description will be avoided here. In the following, the configuration and operation of the transmitter in FIG. 4 will be described in detail.

In the transmitter of FIG. 4, a microphone 1 is connected to an analog amplifier 2, and an output of the analog amplifier 2 is applied to an A/D converter 3. The A/D converter 3 has the same resolution as the D/A converter 34 used in the receiver of FIG. 2, for example, 20 bits. An output of the A/D converter 3 is applied to a fixed contact 41 of a switch 4 and a power level detector 5. The switch 3 has a first fixed contact 42 connected to a transmission signal processing unit 7, and the switch 4 has a second fixed contact 43 connected to the transmission signal processing unit 7 through a digital amplifier 6. The digital amplifier 6 has an amplification ratio of the same value as the attenuation ratio of the digital amplifier 35 in the receiver. An output of the transmission signal processing unit 7 is digitally modulated by a modulator 8, and transmitted from an antenna. The digital signal thus transmitted is received by the receiver of FIG. 2.

The power level detector 5 detects the output power level of the A/D converter 3 to output control data for controlling the operation of the switch 4. Specifically, the power level detector 5 controls the operation of the switch 4 using the control data such that the first fixed contact 42 of the switch 4 is connected to the movable contact 41 when the output power of the A/D converter 3 is higher than a predetermined power level, and the second fixed contact 43 of the switch 4 is connected to the movable contact 41 when the output power of the A/D converter 3 becomes lower than the predetermined power level. In this way, a signal amplified by the digital amplifier 6 to have a higher level is supplied to the transmission signal processing unit 7 when the level of an analog input signal is lower than the predetermined level.

The power level detector 5 controls the switching operation of the switch 4 as described above, as well as sends to the transmission signal processing unit 7 a signal indicating whether or not an analog input signal applied to the microphone 1 is higher or lower than the predetermined level, in other words, a selection signal indicating which of the first fixed contact 42 and second fixed contact 43 is selected. In response to this selection signal, the transmission signal processing unit 7 operates to create a transmission digital signal by adding control bits corresponding to the selection signal to a direct output from the A/D converter 3 or to a digitally amplified output of the A/D converter 3.

The control bits preferably have two bits in order to improve the reliability in consideration of bit errors actually produced on a communication path. Therefore, as an example, the control bits take logical "11" when the power level detector 5 operates the switch 4 to select the output through the first fixed contact 42, and take logical "00" when the power level detector 5 conversely operates the switch 4 to select the output amplified by the digital amplifier 6 through the second fixed contact 43.

The transmission digital signal output by the transmission signal processing unit 7 is modulated in accordance with a predetermined digital modulation scheme by the digital modulator 8, transmitted from a transmission antenna, and received by the receiver having the configuration of FIG. 2. The operation of the receiver has been previously described.

The digital communication system comprised of the transmitter of FIG. 4 and the receiver of FIG. 2 performs the switching and signal amplification in accordance with the level of an analog input signal in the digital signal domain, so that it is free from a discrepancy in amplification ratio between the transmitter and receiver, and noise caused by a phase shift in the amplifier.

It is contemplated in this digital communication system that noise generated internally to the A/D converter 3 in the transmitter could result in an actually available dynamic range narrower than a dynamic range which can be realized in theory. For example, when using a converter having a resolution of 16 bits, a dynamic range of 96 dB can be ensured in theory, whereas the actual dynamic range is approximately 90 dB. Similarly, while a converter having a resolution of 20 bits provides a dynamic range of 120 dB in theory, its actual dynamic range is approximately 108 dB. Even a 24-bit converter, though having a dynamic range of 140 dB in theory, provides an actual dynamic range of as narrow as 120 dB. On the other hand, the dynamic range is less affected by the D/A converter 34 in the receiver.

Thus, a desired dynamic range can be ensured by using the A/D converter 3 in the transmitter having a higher accuracy than the D/A converter 34 in the receiver. For example, when the D/A converter 34 in the receiver has a resolution of 20 bits, one having a resolution of 24 bits may be used for the A/D converter 3 in the transmitter, thereby providing a dynamic range of 120 dB.

While the digital communication system according to the present invention has been described as a radio digital communication system, the present invention is not limited to radio systems but may be implemented as wired digital communication systems. Also, the description has been made for the transmitter wherein the switch 4 is controlled based on a comparison between the level of a digital signal output from the A/D converter 3 and a predetermined level. Alternatively, the level of an analog signal before A/D conversion may be compared with the predetermined level.

Also, in the digital communication system according to the present invention, the predetermined level with which the level of a transmission digital signal is compared in the transmitter need not be a single value. For example, when a transmission digital signal goes up and down about a certain level, the switching is frequently performed. To prevent this, the switching level may be provided with hysteresis. For example, in FIG. 4, frequent switching due to fluctuations in a transmission digital signal can be prevented by setting different values to a first level at which the movable contact 41 of the switch 4 is switched from the first fixed contact 42 to the second fixed contact 43, and a second level at which the movable contact 41 is switched from the second fixed contact 43 to the first fixed contact 42.

As will be apparent from the foregoing description, the present invention produces a remarkable effect of preventing switching noise from occurring in the receiver because the switching and signal amplification in the transmitter are performed in a digital signal domain.

The invention claimed is:

1. A digital communication system comprising at least one transmitter for digitizing an analog input signal for transmission, and at least one receiver for receiving a digital signal transmitted from said transmitter, said digital communication system characterized in that:
    said transmitter converts said analog input signal to a digital signal, and transmits a transmission signal which includes either said digital signal or a digital signal produced by amplifying said digital signal, in accordance with the result of a comparison of a level of said analog input signal or a level of said digital signal with a predetermined level, and a control bit indicative of the result of comparison; and
    said receiver outputs, in accordance with said control bit included in a received digital signal, an analog signal converted from said received digital signal or an analog signal converted from said received digital signal after said received digital signal is digitally amplified.

2. A digital communication system having at least one transmitter and at least one receiver for receiving a digital signal transmitted from said transmitter, said digital communication system characterized in that:
    said transmitter comprises:
    input means for inputting an analog signal;
    an A/D converter for digitizing said analog signal and outputting a digitized signal;
    a selector for selecting said digital signal when a level of said analog signal or a level of the digital signal output from said A/D converter is higher than a predetermined level, and selecting an amplified digital signal produced by amplifying said digital signal when the level of said digital signal is lower than said predetermined level; and
    a transmission output unit for outputting a transmission signal which is a combination of said digital signal or said amplified digital signal selected by said selector and a control bit indicating which of said digital signal and said amplified digital signal is selected, and
    said receiver comprises:
    a processing unit for selectively outputting, in accordance with said control bit included in a received digital signal, either said received digital signal or a digital signal produced by attenuating said received digital signal by a digital amplifier; and
    a reception output unit for outputting an analog signal analog-converted from a digital signal output from said processing unit.

3. A digital communication system according to claim 2, characterized in that:
    said selector comprises:
    a level detector for detecting whether the level of said analog signal or the level of said digital signal is higher or lower than said predetermined level; and
    a switch responsive to an output of said level detector for selecting either a path for sending said digital signal to said transmission output unit or a path for sending said digital signal to said transmission output unit after said digital signal is amplified.

4. A digital communication system according to claim 3, characterized in that:
    said processing unit comprises:
    a received signal processing unit for extracting said control bit from said received digital signal;
    a switch responsive to said control bit for selectively outputting either said received digital signal or a digital signal produced by amplifying said digital signal; and
    a D/A converter for converting an output from said switch to an analog signal.

5. A digital communication system according to claim 1, characterized in that said system is a digital radio communication system.

* * * * *